(12) United States Patent
Tsukada (10) Patent No.: US 8,462,538 B2
(45) Date of Patent: Jun. 11, 2013

(54) SEMICONDUCTOR DEVICE HAVING ITS STANDBY CURRENT REDUCED

(75) Inventor: Shuichi Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 271 days.

(21) Appl. No.: 13/064,180

(22) Filed: Mar. 9, 2011

(65) Prior Publication Data

US 2011/0222329 A1    Sep. 15, 2011

(30) Foreign Application Priority Data

Mar. 12, 2010   (JP) ................................. 2010-055796

(51) Int. Cl.
*G11C 11/00*   (2006.01)
(52) U.S. Cl.
USPC ............... 365/148; 365/63; 365/72; 365/163; 365/205
(58) Field of Classification Search
USPC ............................... 365/72, 63, 148, 163, 205
See application file for complete search history.

(56) References Cited

U.S. PATENT DOCUMENTS

| 7,492,033 B2 * | 2/2009 | Sato et al. ...................... 257/536 |
| 8,320,156 B2 * | 11/2012 | Murooka ....................... 365/148 |
| 2008/0316806 A1 | 12/2008 | Nakai et al. |

FOREIGN PATENT DOCUMENTS

JP   2009-004000 A   1/2009

* cited by examiner

*Primary Examiner* — Hoai V Ho
(74) *Attorney, Agent, or Firm* — McGinn IP Law Group, PLLC (57) ABSTRACT

A semiconductor device includes a plurality of drain lines each being commonly connected to first nodes of a plurality of memory cells, a plurality of bit lines respectively connected to second nodes of the memory cells, a source line, a transistor that connects the drain lines to the source line, and a transistor that connects the source line to a ground potential in response to an access to the memory cell. Under control in which the memory cells are all deactivated, the semiconductor device controls the drain line to a drain potential that is higher than the ground potential, and controls the source line to be in a floating state by deactivating the transistors.

22 Claims, 7 Drawing Sheets

FIG.7

SEMICONDUCTOR DEVICE HAVING ITS STANDBY CURRENT REDUCED

BACKGROUND OF THE INVENTION

1. Field of the Invention

The present invention relates to a semiconductor device, and more particularly relates to a semiconductor device having its standby current reduced.

2. Description of Related Art

In a semiconductor device such as a PC-RAM (Phase Change Random Access Memory) or a Re-RAM (Resistance Random Access Memory), a diode can be used as a selection element for selecting a specific memory cell from a plurality of memory cells. In this case, the diode is connected to a memory element in series, and a voltage is applied to the diode such that it is forward biased when its corresponding word line is selected and reverse biased when the word line is not selected. With this configuration, only when a word line is selected, a current flows through a memory element from a bit line corresponding to the selected word line. An example of a phase change memory device employing the above configuration is disclosed in Japanese Patent Application Laid-open No. 2009-4000.

A configuration for forward biasing or reverse biasing a diode is explained below in detail.

In a semiconductor device in which a diode is used as a selection element for selecting a memory cell, two transistors including a global MOS transistor and a pre-charge MOS transistor are provided for each word line. The gates of the two transistors are connected to a word line. The global MOS transistor is configured to be turned ON when the word line is selected and turned OFF when the word line is not selected. On the other hand, the pre-charge MOS transistor is configured to be turned OFF when the word line is selected and turned ON when the word line is not selected.

The source of the global MOS transistor is connected to a ground line to which a ground potential VSS is supplied, and the drain of the global MOS transistor is commonly connected to cathodes of a plurality of diodes arranged in the word line direction. Hereinafter, a signal line connecting the drain of the global MOS transistor and the cathode of each of the diodes is referred to as "drain line". The source of the pre-charge MOS transistor is connected to a power supply line to which a drain potential VDR is supplied, and the drain of the pre-charge MOS transistor is connected to one end of the drain line. The drain potential VDR is a potential that becomes equal to or higher than a write potential of a bit line when writing data in a memory cell and equal to or higher than a read potential when reading data from a memory cell.

With the above configuration, when a word line is selected, the ground potential VSS is supplied to the cathode of each of the diodes connected to the word line through the drain line and the global MOS transistor corresponding to the word line. Therefore, if the write potential or the read potential is supplied to a bit line, each of the diodes is forward biased. On the other hand, the drain potential VDR is supplied to the cathode of each of the diodes connected to a non-selected word line through the drain line and the pre-charge MOS transistor corresponding to the non-selected word line. Therefore, each of the diodes is reverse biased.

However, the above semiconductor device has a problem that it is difficult to suppress a standby current of a memory mat to a value equal to or smaller than a value of standard. That is, in the above semiconductor device, an off-leak current (sub-threshold current) of the global MOS transistor or a short circuit (defect) of the ground line or the source of the global MOS transistor can cause an increase of the standby current. However, it is difficult to suppress or prevent these currents, and as a result, it is difficult to suppress the standby current of the memory mat to a value equal to or smaller than the value of standard. Details on this aspect are explained below.

In a memory mat, a considerably large number of global MOS transistors are included, for example, $2 \times 10^9$ transistors are included in the case of a 2-Gb product. Therefore, in order to suppress the standby current of the entire memory mats to a value equal to or smaller than the value of standard, it is necessary to suppress the off-leak current of each of the global MOS transistors to a considerably small value. However, in practice, it is a difficult task to be accomplished.

Further, even one place where the ground line or the source of the global MOS transistor is short-circuited can cause the standby current of the memory mat to exceed the value of standard. However, as described above, because there are a considerably large number of global MOS transistors in the memory mat and there are a large number of ground lines, it is difficult in practice to prevent the short circuits at all the places.

SUMMARY

Therefore, a semiconductor device that can suppress the standby current of the memory mat to a value equal to or smaller than the value of standard with an easily achievable configuration has been required.

In one embodiment, there is provided a semiconductor device comprising: a plurality of memory cells each having first and second nodes; a first signal line commonly connected to the first nodes of the memory cells; a plurality of second signal lines each connected to an associated one of the second nodes of the memory cells; a third signal line; a first transistor connected between the first signal line and the third signal line; a second transistor connected between the third signal line and a line of a first potential; and a control circuit that brings the first signal lines into a second potential that is higher than the first potential and turns the first and second transistors off so that the third signal line to be in a floating state when the memory cells are not selected.

In another embodiment, there is provided a semiconductor device comprising: at least one word line and at least one bit line, a memory mat including a plurality of memory cells arranged at every intersection of the word line and the bit line and each including a memory element and a diode connected in series, a first signal line that is provided for each word line and connected to the cathode of the diode in a corresponding one of the memory cells, at least one first transistor arranged for each word line, of which a control terminal is connected to its corresponding word line and one control target terminal is connected to the first signal line, and a control circuit that supplies a first potential to the other control target terminal of the first transistor when the memory mat is selected and puts the other control target terminal of the first transistor in a floating state when the memory mat is not selected.

In still another embodiment, there is provided a data processing system comprising: a data processor and a memory connected to the data processor, in which the memory includes a plurality of first signal lines each being commonly connected to first nodes of a plurality of memory cells, a plurality of second signal lines respectively connected to second nodes of the memory cells, a third signal line, a first transistor that connects the first signal lines to the third signal line, a second transistor that connects the third signal line to a first potential in response to an access to a memory cell, and a control circuit. The control circuit, under control in which the memory cells are all deactivated, controls the first signal lines to a second potential that is higher than the first potential and controls the first and second transistors to be deactivated, thus controlling the third signal line to be in a floating state.

According to the present invention, it is possible to suppress the standby current of the memory mat to a value equal to or smaller than the value of standard by using a configuration including the second transistor and the third signal line that can be easily realized.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the present invention relates to a semiconductor device including a plurality of first signal lines (drain lines) each being commonly connected to first nodes of a plurality of memory cells, a plurality of second signal lines (bit lines) respectively connected to second nodes of the memory cells, a third signal line (source line), a first transistor (global MOS transistor) that connects the first signal lines to the third signal line, a second transistor (mat-active MOS transistor) that connects the third signal line to a first potential in response to an access to the memory cell, and a control circuit. Under control in which the memory cells are all deactivated, the control circuit controls the first signal lines to a second potential that is higher than the first potential, and controls the first and second transistors to be deactivated, thus controlling the third signal line to be in a floating state.

With the above configuration, it is possible to suppress the standby current of the memory mat to a value equal to or smaller than the value of standard by using a configuration including the second transistor and the third signal line that can be easily realized.

Another example of the technical concept of the present invention to solve the problems is a semiconductor device that includes at least one word line and at least one bit line, a memory mat including a plurality of memory cells each including a memory element and a diode being arranged at each intersection of the word line and the bit line, a first signal line (drain line) that is arranged for each word line and connected to the cathode of a diode in a corresponding memory cell, at least one first transistor (global MOS transistor) that is arranged for each word line, of which a control terminal is connected to a corresponding word line and one control target terminal is connected to the first signal line, and a control circuit. When a memory mat is selected, the control circuit supplies a first potential to the other control target terminal of the first transistor, and when the memory mat is not selected, the control circuit sets the other control target terminal of the first transistor to be in a floating state.

Also with the above configuration, it is possible to suppress the standby current of the memory mat to a value equal to or smaller than the value of standard by using a configuration of floating the other control target terminal of the first transistor, which can be easily realized.

Preferred embodiments of the present invention will be explained below in detail with reference to the accompanying drawings.

Figure 1:
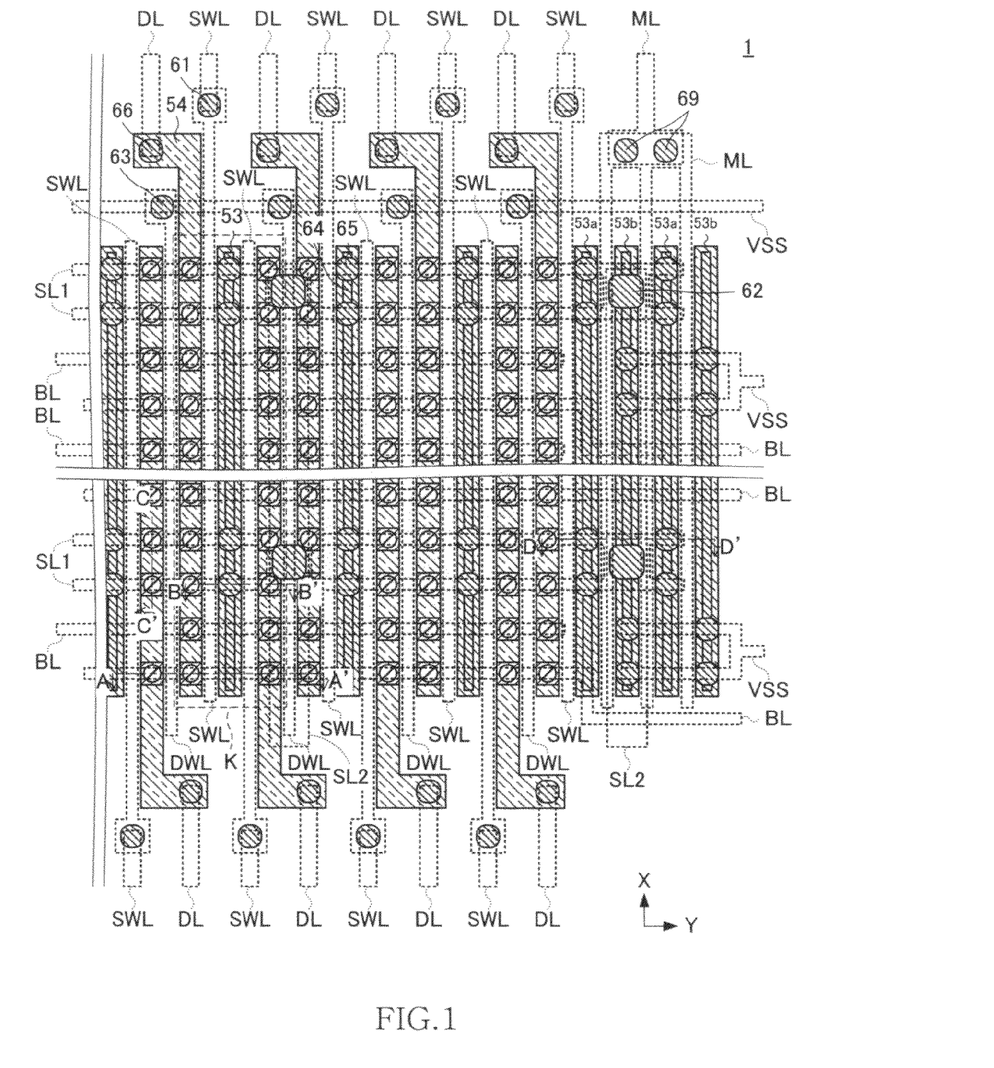
FIG. 1 is a plan view of a semiconductor device according to an embodiment of the present invention.
Figure 2A:
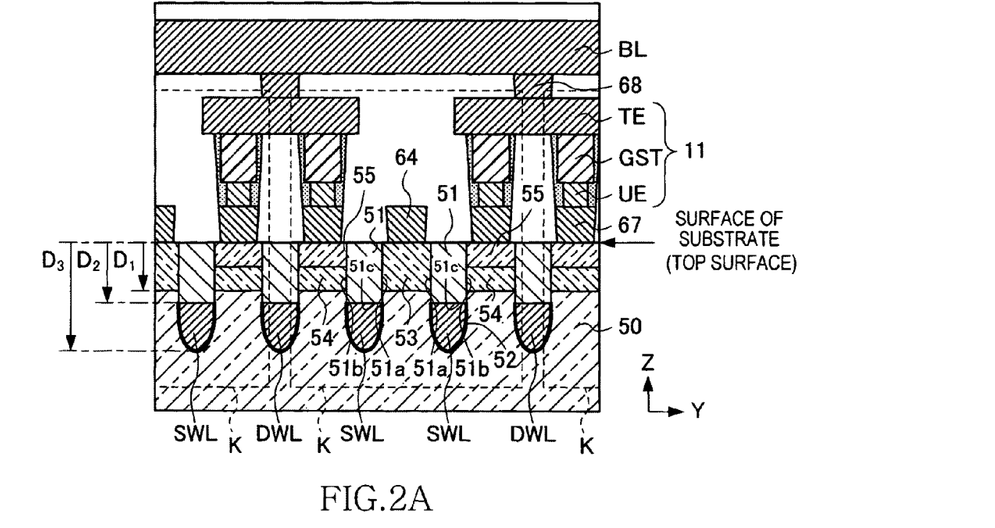
FIGS. 2A and 2B are cross sections of the semiconductor device cut along a line A-A' and a line B-B' shown in FIG. 1, respectively.
Figure 2B:
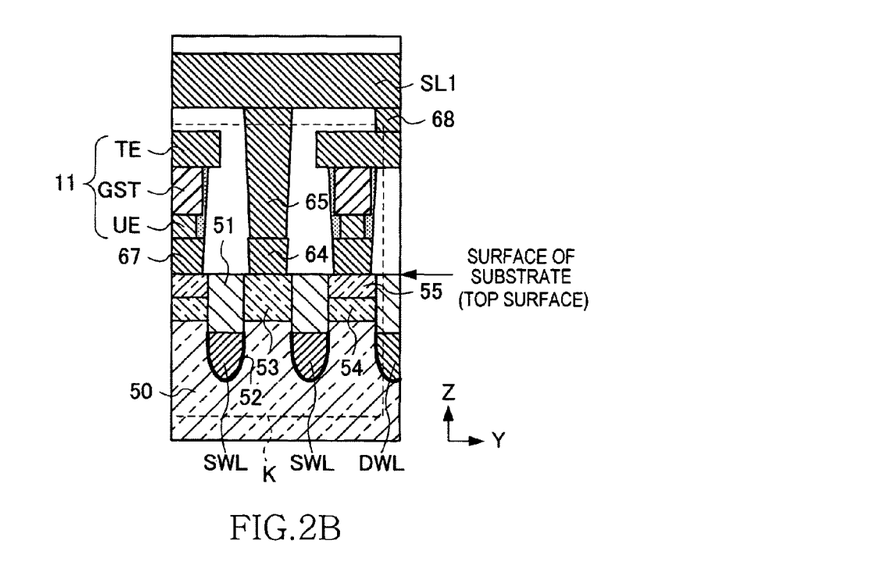
Figure 3A:
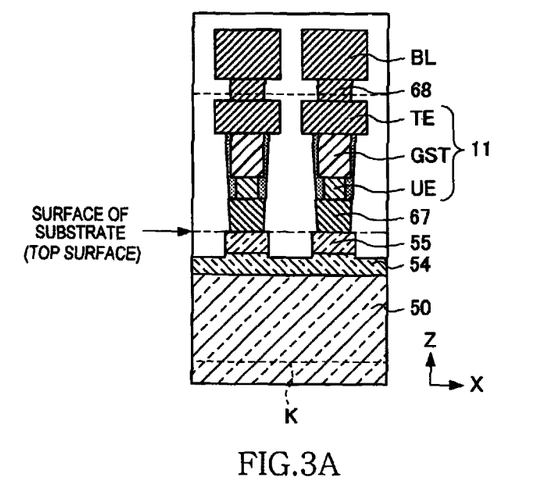
FIGS. 3A and 3B are cross sections of the semiconductor device cut along a line C-C' and a line D-D' shown in FIG. 1, respectively.
Figure 3B:
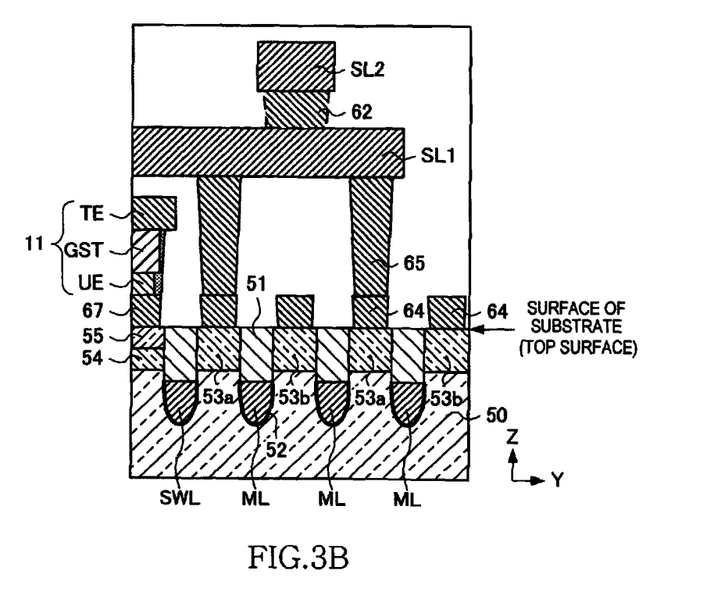

FIG. 1 is a plan view of a semiconductor device 1 according to an embodiment of the present invention. In FIG. 1, some of constituent elements are shown in a transparent manner and some of the constituent elements are omitted from the drawing, to make a configuration of the semiconductor device 1 be easily understood. FIGS. 2A and 2B are cross sections of the semiconductor device 1 cut along a line A-A' and a line B-B' shown in FIG. 1, respectively. FIGS. 3A and 3B are cross sections of the semiconductor device 1 cut along a line C-C' and a line D-D' shown in FIG. 1, respectively.

The semiconductor device 1 is a PC-RAM including a memory element 11 that includes a phase change memory element GST, and as shown in FIGS. 2A to 3B, the semiconductor device 1 is formed on a surface of a P-type (first conductive type) semiconductor (silicon) substrate 50. In the present invention, the P-type semiconductor substrate means that it includes a P-type diffusion area (Pwell) formed on the surface of a silicon substrate. FIG. 1 shows vicinity of an edge portion of a memory mat of the PC-RAM in the Y direction (bit line direction).

A circuit configuration of the semiconductor device 1 is explained first.

Figure 4:
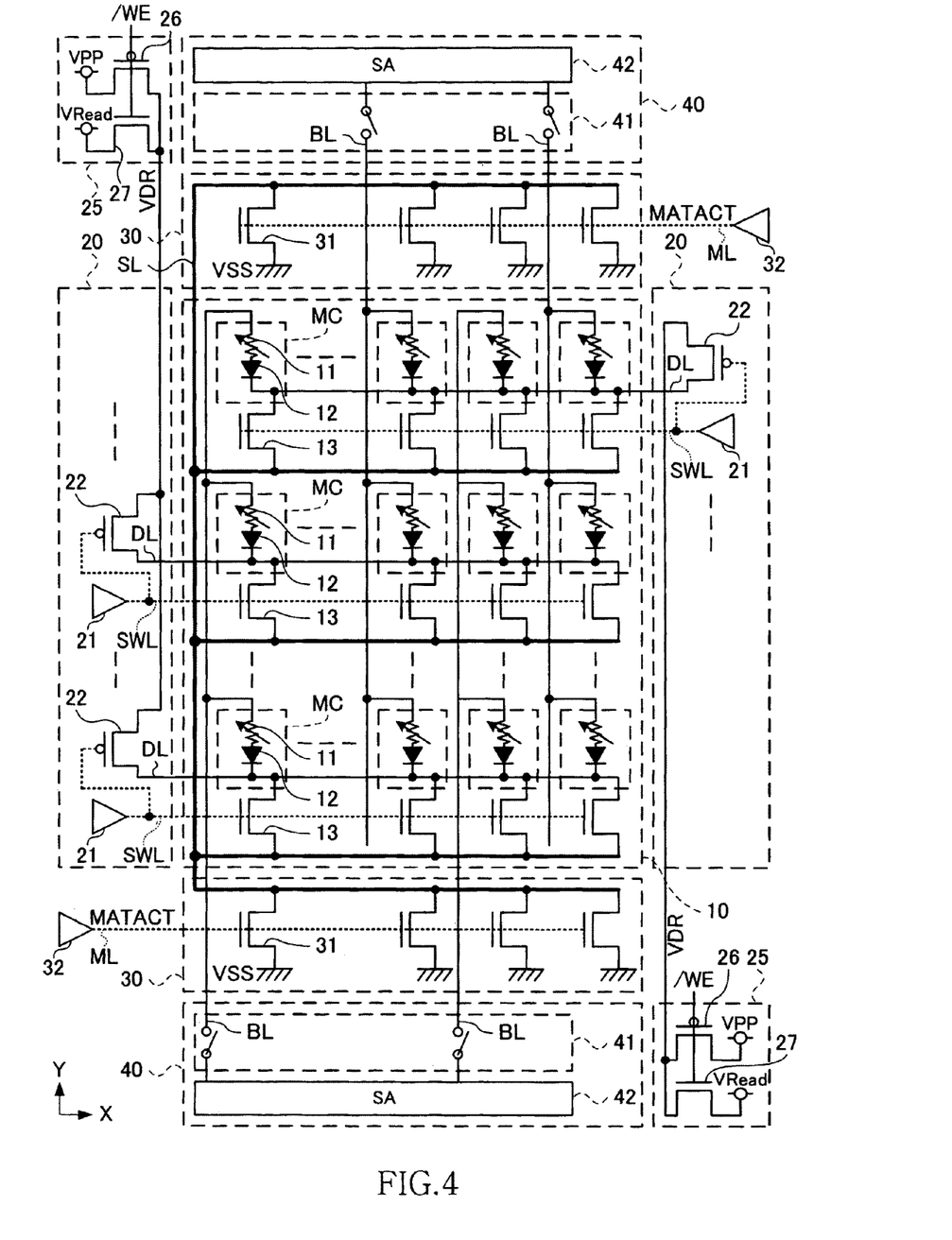
FIG. 4 shows an equivalent circuit of the semiconductor device according to an embodiment of the present invention.

FIG. 4 shows an equivalent circuit of the semiconductor device 1. FIG. 4 shows a circuit configuration of a memory mat. Note that there are some parts omitted from the drawing. As shown in FIG. 4, the semiconductor device 1 includes a memory mat 10, a sub-word line control unit 20, a power supply unit 25 (power supply circuit), a mat-active control unit 30, and a bit-line control unit 40.

The memory mat 10 is a minimum division unit of a memory cell array in which a plurality of memory cells MC constituting the semiconductor device 1 are arranged in a matrix form, including a plurality of sub-word lines SWL (fourth signal lines) extending in the X direction (first direction), a plurality of bit lines BL (second signal lines) extending in the Y direction (second direction), and a plurality of memory cells MC arranged at every intersections of the sub-word lines SWL and the bit lines BL. In the semiconductor device 1, a word line is hierarchized with a main word line (not shown) and a sub-word line SWL. In the present invention, the word line includes the main word line and the sub-word line SWL or either one of the two, or a word line that is not hierarchized.

The memory mat 10 further includes a global MOS transistor 13 (first transistor) of which a control electrode (gate) is connected to the sub-word lines SWL, and a drain line DL (first signal line) and a source line SL (third signal line) connected to one control target electrode (drain) and the other control target electrode (source) of the transistor 13, respectively. Among these signal lines, the drain line DL extends in the X direction (first direction) along the sub-word lines SWL. In other words, a plurality of memory cells MC arranged in the X direction (first direction) connected to one drain line DL (first signal line) makes a segment memory cell array, and one memory cell array is constituted by a plurality of segment memory cell arrays arranged in the Y direction (second direction).

Each of the memory cells MC includes the memory element 11 and a selection element 12. The memory element 11 includes a phase change material. Although the phase change material is not particularly limited to a specific material as long as it is a material having at least two phase states and different electrical resistance according to the phase state, it is preferable to select a so-called "chalcogenide material". The chalcogenide material can take either one of an amorphous phase having a relatively high resistance and a crystal phase having a relatively low resistance in a selective manner, indicating, for example, an alloy containing at least one of germanium (Ge), antimony (Sb), tellurium (Te), indium (In), and selenium (Se). For example, the alloy includes a binary alloy such as GaSb, InSb, InSe, $Sb_2Te_3$, and GeTe, a ternary alloy such as $Ge_2Sb_2Te_5$, InSbTe, GaSeTe, $SnSb_2Te_4$, and InSbGe, and a quarternary alloy such as AgInSbTe, (GeSn)SbTe, GeSb(SeTe), and $Te_{81}Ge_{15}Sb_2S_2$.

The selection element 12 is constituted by a diode. Therefore, the selection element 12 has a property that a current flows from the anode side to the cathode side when a voltage on the anode side is higher than a voltage on the cathode side (forward bias) and does not flow when the voltage on the cathode side is higher than the voltage on the anode side (reverse bias). A specific configuration of the selection element 12 and its constituent material are described in detail later.

The memory element 11 and the selection element 12 are connected in series between the bit line BL and the drain line DL. Specifically, one end of the memory element 11 (second node of the memory cell MC) is connected to the bit line BL, and the other end is connected to the anode of the selection element 12. The cathode of the selection element 12 (first node of the memory cell MC) is connected to the drain line DL.

The transistor 13 is an N-channel MOS transistor, which is arranged for each of the sub-word lines SWL. A first electrode (gate electrode) of the transistor 13 is connected to the sub-word line SWL, a second control target electrode (drain) is connected to the drain line DL (first signal line), and a third control target electrode (source) is connected to the source line SL (third signal line). Although it appears that the transistor 13 is arranged for each of the memory cells MC in FIG. 4, in practical cases, the transistor 13 connected to one sub-word line SWL is one elongated transistor. Because this aspect is related to a configuration of the transistor 13, it is explained later together with other aspects. The transistor 13 is turned ON when its corresponding sub-word line SWL is activated, electrically connecting the drain line DL and the source line SL. On the other hand, the transistor 13 is turned OFF when its corresponding sub-word line SWL is not activated, electrically disconnecting the drain line DL from the source line SL. The term "turned ON" means an electrically conductive state, and the term "turned OFF" means an electrically non-conductive state. The same holds true for the subsequent explanations. In addition, the term "off-leak" means a leak current that flows in the electrically non-conductive state.

The sub-word line control unit 20 includes a sub-word line driver 21 and a pre-charge MOS transistor 22 (third transistor) for each of the sub-word lines SWL. The sub-word line control unit 20 is arranged at both sides of the memory mat 10 in the X direction, and is connected to every other sub-word line SWL arranged in the Y direction.

The sub-word line driver 21 performs activation control of its corresponding sub-word line SWL in response to control of a word-line control circuit (not shown). Specifically, the sub-word line driver 21 activates a sub-word line SWL that is selected by the word-line control circuit and deactivates a sub-word line SWL that is not selected by the word-line control circuit. The sub-word line driver 21 performs the activation of the sub-word line SWL by supplying a word line voltage VWL (about 2.4 volts (V)) to the sub-word line SWL. The sub-word line driver 21 performs the deactivation of the sub-word line SWL by supplying the ground potential VSS (=0.0 V) to the sub-word line SWL. Although it is not shown in the drawing, the sub-word line driver 21 is connected to a power supply line to which the word line voltage VWL is supplied and a ground line to which the ground potential VSS is supplied, in order to perform the activation and deactivation of the sub-word line SWL.

The transistor 22 is a P-channel MOS transistor of which a control electrode (gate) is connected to the sub-word line SWL. One control target electrode (drain) of the transistor 22 is connected to its corresponding drain line DL. On the other hand, the other control target electrode (source) of the transistor 22 is connected to the power supply unit 25, and the drain potential VDR (second potential) is supplied to the drain line DL from the power supply unit 25 via the transistor 22.

The transistor 22, which is a P-channel type, is turned ON when its corresponding sub-word line SWL is deactivated, electrically connecting its corresponding drain line DL and the power supply unit 25. With this configuration, the drain potential VDR is supplied to the drain line DL corresponding to a selected word line from the power supply unit 25. On the other hand, the transistor 22 is turned OFF when its corresponding sub-word line SWL is activated, electrically disconnecting its corresponding drain line DL from the power supply unit 25.

The power supply unit 25 is a circuit that generates the drain potential VDR and supplies the drain potential VDR to the sub-word line control unit 20 via a predetermined power supply line (second power supply line). Specifically, the power supply unit 25 includes a P-channel MOS transistor 26 and an N-channel MOS transistor 27, and a write enable signal /WE is supplied to the gates of the transistors 26 and 27. The drains of the transistors 26 and 27 are connected to each other, and the drain potential VDR is extracted from a connection point between the drains. A write potential VPP (about 5.0 V: third potential) which is applied to the bit line BL when a write operation is performed on a memory cell MC is supplied to the source of the transistor 26. On the other hand, a read potential VRead (about 1.5 V: second potential) which is applied to the bit line BL when a read operation is performed on the memory cell MC is supplied to the source of the transistor 27.

The "/" in the "/WE" indicates that the write enable signal is an active low signal. That is, the write enable signal /WE is activated to the low level when an access to the memory mat 10 is a write access and deactivated to the high level when the access is a read access. A potential of the write enable signal makes a transition between 0 V and the write potential VPP. Therefore, when there is a write access to the memory mat 10, the transistor 26 is turned ON and the transistor 27 is turned OFF, and as a result, the drain potential VDR becomes equal to the write potential. On the other hand, when there is a read access to the memory mat 10 or there is no access to the memory mat 10 (for example, when the semiconductor device is in an idle state with no access from outside (standby mode)), the transistor 26 is turned OFF and the transistor 27 is turned ON, and as a result, the drain potential VDR becomes equal to the read potential VRead. The write enable signal can be a term for an external terminal of the semiconductor device pertaining to a write command (write mode). In addition, it is also possible to make the MOS transistor 27 a P-type MOS transistor and to supply an inverted signal of the write enable signal to the gate electrode of a P-channel MOS transistor 27.

The mat-active control unit 30 is arranged at both sides of the memory mat 10 in the Y direction, including a mat-active MOS transistor 31 (second transistor). Although it appears that a large number of transistors 31 are arranged in FIG. 4, in practical cases, three elongated transistors 31 are arranged for each side. Because this aspect is related to a configuration of the transistor 31, it is explained later together with other aspects.

The transistor 31 is an N-channel MOS transistor. One control target electrode (drain) of the transistor 31 is connected to the source line SL, and the other control target electrode (source) is connected to the ground line (first power supply line) to which the ground potential VSS (first potential) is supplied. A control electrode (gate) of the transistor 31 is connected to a mat active line ML (sixth signal line), to which a selection signal MATACT is input from a memory mat driver 32.

The selection signal MATACT is a signal indicating a fact that a desired memory mat 10 is selected from among a plurality of memory mats 10. The memory mat driver 32 activates the selection signal MATACT in response to control of a word-line control circuit (not shown), and outputs the selection signal MATACT to the mat active line ML. Specifically, the memory mat driver 32 activates the selection signal MATACT when the memory mat 10 is selected by the word-line control circuit, and deactivates the selection signal MATACT when the memory mat 10 is not selected. The case where the memory mat 10 is selected means that any one of the sub-word lines SWL in the memory mat is selected by the word-line control circuit, in other words, a case where there is an access (write or read) to a memory cell MC in the memory mat 10.

The transistor 31 is turned ON when the selection signal MATACT is activated, electrically connecting the source line SL and the ground line. Therefore, in this case, a potential of the source line SL becomes the ground potential VSS. On the other hand, when the selection signal MATACT is deactivated, the transistor 31 is turned OFF, electrically disconnecting the source line SL from the ground line. The fact that the selection signal MATACT is deactivated means that no sub-word line SWL is selected. Therefore, in this case, all the transistors 13 in the memory mat 10 are turned OFF without fail. Therefore, the source line SL is not connected to any power supply line, being in an electrically floating state.

The bit-line control unit 40 includes a bit line selector 41 and a sense amplifier (SA) 42. The bit-line control unit 40 is arranged on further outer side of the mat-active control unit 30 at both sides of the memory mat 10 in the Y direction, being connected to a plurality of alternate bit lines BL arranged in the X direction.

The sense amplifier 42 is supplied with the write potential VPP and the read potential VRead described above from a power supply unit (not shown). When performing a write operation of writing data in the memory cell MC, the sense amplifier 42 supplies the write potential VPP to the bit line selector 41. On the other hand, when performing a read operation of reading data from the memory cell MC, the sense amplifier 42 supplies the read potential VRead to the bit line selector 41.

The bit line selector 41 is constituted by a group of switch elements arranged for each of the bit lines BL. The switch element is configured to be turned ON when its corresponding bit line BL is selected, and turned OFF otherwise. Therefore, the write potential VPP is supplied to a selected bit line BL at the time of the write operation and the read potential VRead is supplied to the selected bit line BL at the time of the read operation. The bit lines that are not selected are in floating states because their corresponding switch elements are turned OFF.

Table 1 shows a potential of each line and an activation state of each transistor corresponding to a selection state of the memory mat 10, a selection state of the sub-word line SWL, and a type of the access (write or read).

TABLE 1

| | Memory mat selection | | | | |
| --- | --- | --- | --- | --- | --- |
| | Corresponding SWL selected | | Corresponding SWL non-selected | | Memory mat |
| | Write | Read | Write | Read | non-selected |
| Mat active line ML | VWL | | | | VSS |
| Sub-word line SWL | VWL | | VSS | | |
| Transistor 31 | ON | | | | OFF |
| Transistor 13 | ON | | OFF | | |
| Transistor 22 | OFF (Weakly ON) | OFF | | ON | |
| Source line SL | VSS | | | | Floating |
| Drain line DL | VSS | | VPP | | VRead |
| Selected bit line BL | VPP | VRead | VPP | VRead | Floating |

As shown in Table 1, when the memory mat 10 is selected, the transistor 31, the transistor 13 corresponding to a selected sub-word line SWL, and the transistor 22 corresponding to a non-selected sub-word line SWL are turned ON, and the other transistors are turned OFF. Therefore, both the source line SL and the drain line DL corresponding to the selected sub-word line SWL are connected to the ground line, so that the ground potential VSS is supplied to the source line SL and the drain line DL. This causes the selection element 12 in the memory cell MC corresponding to the selected sub-word line SWL to be forward biased when the write potential VPP or the read potential VRead is supplied to the bit line BL, and as a result, it is possible to perform an access (write or read) to the memory element 11.

On the other hand, the drain line DL corresponding to the non-selected sub-word line SWL is connected to the power supply unit 25, and is supplied with the write potential VPP when writing data and the read potential VRead when reading data. This causes the selection element 12 in the memory cell MC corresponding to the non-selected sub-word line SWL to be reverse biased or zero biased when the write potential VPP or the read potential VRead is supplied to the bit line BL, and as a result, an access (write or read) to the memory element 11 is not performed.

When the memory mat 10 is not selected (under control that all the memory cells MC in the memory mat 10 are deactivated), the drain potential VDR (drain potential VDR=read potential VRead) is supplied to all the drain lines DL. On the other hand, because the transistors 31 and 13 are all turned OFF, the source line SL is in a floating state. Therefore, an increase of the standby current due to the off-leak current of the transistor 13 or the short circuit of the source line SL or the source of the transistor 13 can be suppressed, making it possible to suppress the standby current of the memory mat to a value equal to or smaller than the value of standard.

When the memory mat 10 is not selected, the transistor 22 is turned ON, and therefore the read potential VRead is supplied to the drain line DL. However, because all the bit lines BL are in floating states and the selection element 12 is reverse biased or zero biased at this time, no current flows from each of the bit lines BL to its corresponding drain line DL. Therefore, the standby current never flows through the drain line DL. As a first case, when the off-leak current of a plurality of transistors 13 is dominant in the standby current of the memory mat, the standby current of the memory mat becomes a balance between a total capability 1 of the transistors 13 and a total capability 2 of the transistors 31. As a second case, when a short circuit (defect) of the source line SL or a short circuit of the source of the transistor 13 (short circuit (defect) between a first diffusion area 53 and a second diffusion area 54) is dominant in the standby current of the memory mat, the standby current of the memory mat becomes a balance between the total capability 1 and the total capability 2.

The total capability 1 and the total capability 2 in the first case are described below. A plurality of memory cells MC arranged in the X direction (first direction), which is connected to one drain line DL (first signal line) makes a segment memory cell array, and one transistor 22 is allocated to one segment memory cell array. One transistor 22 supplies the drain potential VDR to one drain line DL. As can be seen from Table 1, one transistor 22 supplies the same potential as a potential to be supplied to the bit line BL (the write potential VPP when writing data and the read potential VRead when reading data) to its corresponding drain line DL, in order to suppress writing data in a non-selected segment memory cell array. Therefore, because a large current does not need to flow through the transistor 22, its capability 3 can be small. Furthermore, in order to make a transition of one drain line DL corresponding to a selected segment memory cell array that is a write target to a potential of VSS by a plurality of global MOS transistors 13 corresponding to a selected sub-word line SWL, a current supply capability of a corresponding transistor 22 must be designed to be small. By designing the current supply capability of the transistor 22 to be small, even if one drain line DL corresponding to a selected segment memory cell array makes a transition to the potential of VSS, the drain potential VDR does not drop. For this reason, the capability of the transistor 22 is smaller than the capability of the global MOS transistor 13. In other words, it is preferable that the total capability 1 of a plurality of global MOS transistors 13 corresponding to one segment memory cell array be more than ten times larger than the capability 3 of a corresponding transistor 22. In addition, the total capability 1 of a plurality of global MOS transistors 13 corresponding to one segment memory cell array must be larger than a capability 4 of at least one corresponding selection element 12, in order to flow a sufficient write current to a plurality of memory cells MC included in the segment memory cell array. On the other hand, the total capability 2 of a plurality of mat-active MOS transistors 31 is smaller than the capability 1 of a plurality of global MOS transistors 13 corresponding to a plurality of segment memory cell arrays. The reason is that all the segment memory cell arrays are not subject to a write (reset, set) or a read at the same time. In the case of ten or more segment memory cell arrays, the total capability 2 of a plurality of mat-active MOS transistors 31 is equal to or smaller than 1/10.

The total capability 1 and the total capability 2 the second case are described in detail below while explaining a configuration of the semiconductor device 1, which is described later.

Figure 5A:
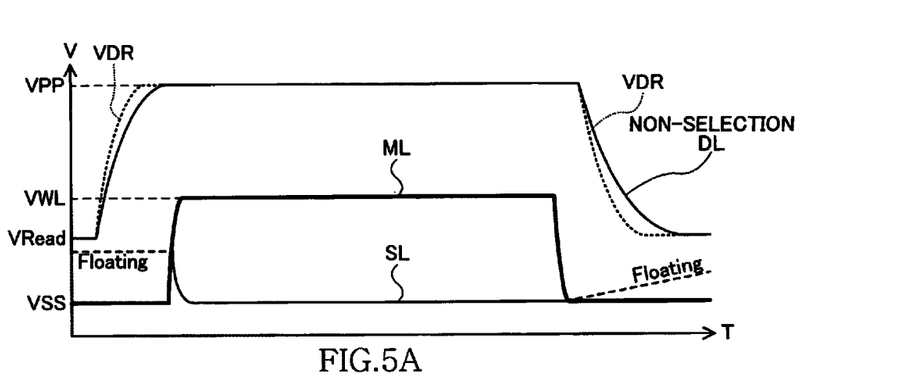
FIGS. 5A to 5C are graphs showing temporal potential changes of each line at the time of writing.
Figure 5B:
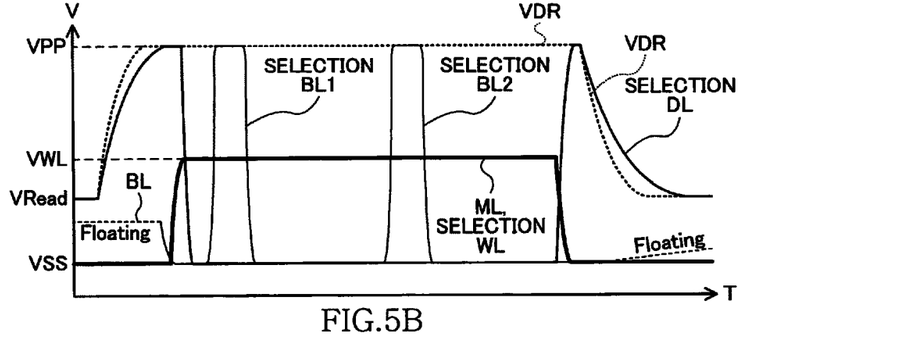
Figure 5C:
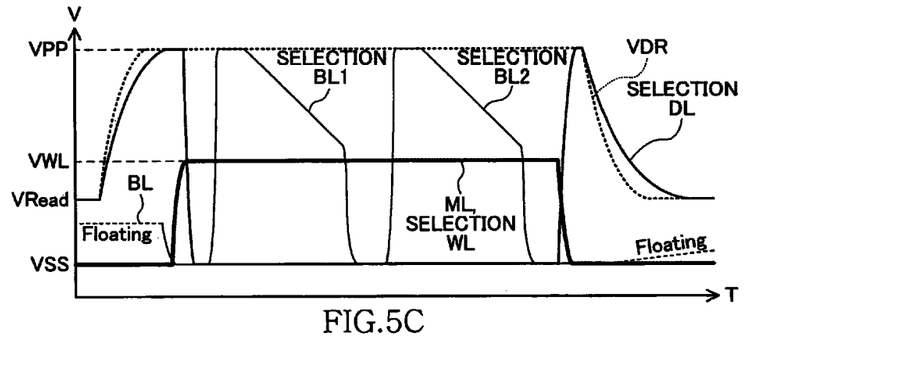
Figure 6A:
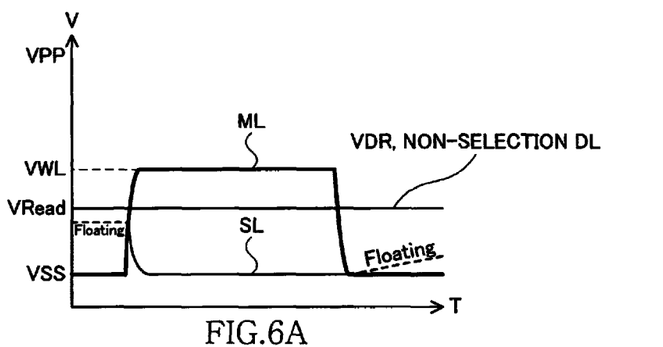
FIGS. 6A to 6C are graphs showing temporal potential changes of each line at the time of reading.
Figure 6B:
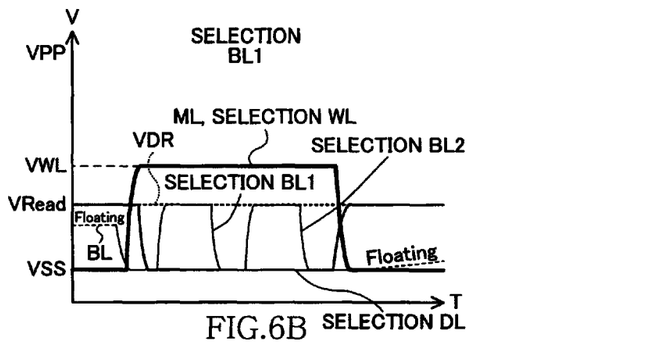
Figure 6C:
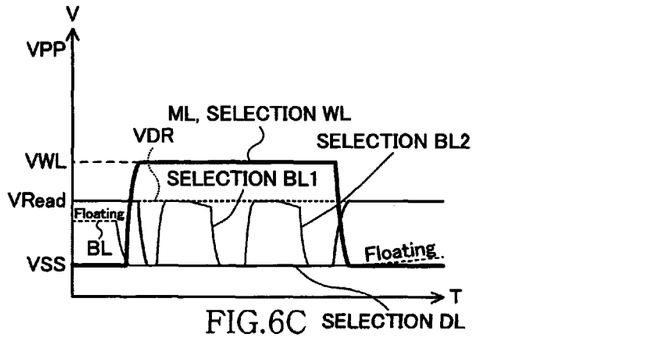

FIGS. 5 and 6 are graphs showing temporal potential changes of each line at the time of writing and reading, respectively. A transition of the potential of each line is explained below with reference to FIGS. 5 and 6.

The write operation is explained first. FIG. 5A shows a potential of a source line SL and a potential of a drain line DL corresponding to a non-selected sub-word line SWL (hereinafter, "non-selection DL"), as well as a potential of a mat active line ML and the drain potential VDR. FIGS. 5B and 5C show a potential of a selected sub-word line SWL (hereinafter, "selection WL"), a potential of a drain line DL corresponding to the selection WL (hereinafter, "selection DL"), and a potential of a bit line BL, as well as a potential of a mat active line ML and the drain potential VDR.

In FIGS. 5A to 5C, a case is shown in which writing is performed for two memory cells MC corresponding to the same sub-word line SWL in a consecutive manner. "Selection BL1" and "selection BL2" in FIGS. 5B and 5C indicate potentials of the bit lines BL corresponding to the first memory cell MC and the second memory cell MC, respectively. The selected bit lines BL are collectively called as "Selection BL" below. FIG. 5B shows a case of phase-changing the memory element 11 of a selection target memory cell MC to an amorphous phase (Reset), and FIG. 5C shows a case of phase-changing the memory element 11 of the selection target memory cell MC to a crystal phase (Set).

As shown in FIGS. 5A to 5C, in an initial state, the source line SL is in a floating state, and the potential of the drain line DL is the read potential VRead. The bit line BL is also in a floating state.

At the time of starting the write operation, the write enable signal /WE is first activated (not shown), and the drain potential VDR is increased up to the write potential VPP. With the increase of the drain potential VDR, the potential of the drain line DL is also increased up to the write potential VPP.

Thereafter, the mat active line ML and the selection WL are activated, and as shown in FIG. 5A, the potential of the source line SL is decreased down to the ground potential VSS. With the decrease of the potential of the source line SL, the potential of the selection DL is also decreased down to the ground potential VSS as shown in FIGS. 5B and 5C. At this time, because the potential of the selection WL is the word line voltage VWL (about 2.4 V), the transistor 22 shown in FIG. 4 actually becomes weakly turned ON as described in Table 1 (in parentheses). However, because the transistor 13 can take a considerably large size, as will be described later, and the transistor 22 can take a small size without causing any problem, it is possible to decrease the potential of the selection DL substantially down to the ground potential VSS. The potential of the non-selection DL is maintained to the write potential VPP as shown in FIG. 5A.

Subsequently, the potential of the selection BL is increased up to the write potential VPP as shown in FIGS. 5B and 5C, and after an elapse of a predetermined time, decreased down to the ground potential VSS. This is for performing a write operation of writing data in the memory cell MC, and as shown in FIGS. 5B and 5C, in a reset time, the potential of the selection BL is gradually decreased with a time longer than in a set time. With this operation, the phase state of the memory element 11 after the potential of the selection BL is decreased becomes the amorphous phase in the reset time and the crystal phase in the set time.

When the write operation is completed, the mat active line ML and the selection WL are deactivated. With this operation, the potential of the selection DL is increased up to the write potential VPP, and the source line SL is returned to the floating state. Thereafter, the write enable signal /WE is deactivated (not shown), and the drain potential VDR and the potential of each of the drain lines DL are returned to the read potential VRead.

In this manner, at the time of the write operation, the potential of the source line SL is decreased down to the ground potential VSS only during the write operation is performed. After the write operation is completed, the source line SL is returned to the floating state. Therefore, a suppression of the standby current of the memory mat to a value equal to or smaller than the standard value is realized.

The read operation is explained next. FIGS. 6A to 6C are corresponding to FIGS. 5A to 5C except that they show potential changes at the time of the read operation instead of the write operation. FIG. 6B shows a case of reading memory information from the memory element 11 in the amorphous phase, and FIG. 6C shows a case of reading memory information from the memory element 11 in the crystal phase.

An initial state is the same as that in the write operation. That is, as shown in FIGS. 6A to 6C, the source line SL is in a floating state, and the potential of the drain line DL is the read potential VRead. In addition, the bit line BL is also in a floating state.

At the time of starting the read operation, the mat active line ML and the selection WL are activated, and as shown in FIG. 6A, the potential of the source line SL is decreased down to the ground potential VSS. With this operation, the potential of the selection DL is also decreased down to the ground potential VSS as shown in FIGS. 6B and 6C. The potential of the non-selection DL is maintained to the read potential VRead as shown in FIG. 6A.

Subsequently, the potential of the selection BL is increased up to the read potential VRead as shown in FIGS. 6B and 6C, and after an elapse of a predetermined time, decreased down to the ground potential VSS.

If the potential of the selection BL is increased up to the read potential VRead, a current (read current) flows through the selection BL according to a resistance value of the memory element 11. When the memory element 11 is in a high resistance state (amorphous phase), the read current is relatively small, and therefore, as shown in FIG. 6B, a drop of the potential of the selection BL is hardly observed. On the other hand, when the memory element 11 is in a low resistance state (crystal phase), the read current is relatively large, and therefore, as shown in FIG. 6C, a drop of the potential of the selection BL is observed.

When the read operation is completed, the mat active line ML and the selection WL are deactivated. With this operation, the potential of the selection DL is returned to the read potential VRead, and the source line SL is returned to the floating state.

In this manner, also in the read operation, the potential of the source line SL is decreased down to the ground potential VSS only during the read operation is performed. After the read operation is completed, the source line SL is returned to the floating state. Therefore, a suppression of the standby current of the memory mat to a value equal to or smaller than the standard value is realized.

The configuration of the semiconductor device 1 is explained next.

As shown in FIG. 1, the semiconductor device 1 includes a plurality of sub-word lines SWL wired in the X direction and a plurality of bit lines BL wired in the Y direction. Each of the sub-word lines SWL is a line conductor extending in the X direction, which is formed with a material such as doped silicon for example. On the other hand, each of the bit lines BL is a line conductor extending in the Y direction, which is formed with a metallic material such as copper (Cu) for example.

Although it is not shown in the drawing, a row decoder is provided at both ends of the memory mat in the X direction. Each of the sub-word lines SWL is drawn to an upper layer via a contact conductor 61 shown in FIG. 1, and is connected to the row decoders at both ends one by one in an alternate manner through a wiring pattern on the upper layer. Furthermore, a column decoder is provided at both ends of the memory mat in the Y direction, and each of the bit lines BL is connected to the column decoders at both ends one by one in an alternate manner.

The semiconductor device 1 further includes a source line SL. As shown in FIG. 1, the source line SL includes a source line SL1 (first partial line) extending in the Y direction and a source line SL2 (second partial line) extending in the X direction. That is, the source line SL is arranged in a mesh pattern.

The source line SL1 is a substitute for two adjacent bit lines BL from among a plurality of bit lines, and its configuration is same as that of the bit line BL. The bit lines BL are arranged at regular intervals including the source line SL1. The replacement of the bit lines BL with the source line SL1 is performed for every predetermined number of bit lines BL. The source line SL2 is arranged above the source line SL1 and the bit line BL, and as shown in FIGS. 1 and 3B, connected to the source line SL1 via, a contact conductor 62. The source line SL2 is provided to connect the source lines SL1 in a mutual manner.

As shown in FIG. 1 and the like, every third sub-word line SWL is set to a dummy word line DWL (fifth signal line), and all the sub-word lines SWL including the dummy word line DWL are arranged at regular intervals. That is, two sub-word lines SWL and one dummy word line DWL makes a unit configuration, and this unit configuration is repeatedly arranged in the Y direction. The sub word lines SWL and the dummy word lines DWL have the same configuration. Such dummy word lines DWL are provided because it is preferable to adopt a layout in which an occupation area per memory cell MC becomes $6F^2$ (where F is minimum feature size), and at the same time, to make a wiring density of the sub-word lines SWL constant in order to secure a decent process condition.

Furthermore, as shown in FIGS. 1 and 3B, three sub-word lines located at one end of the memory mat in the Y direction are used as the mat active line ML (sixth signal line) for supplying the selection signal MATACT. The mat active line ML is drawn to an upper layer via a contact conductor 69 (see FIG. 1) provided at one end of the memory mat in the X direction, and is connected to the memory mat driver 32 shown in FIG. 4 through a wiring pattern on the upper layer. Although it is not shown in FIG. 1, the mat active line ML is also provided at the other end of the memory mat in the Y direction. This mat active line ML is connected to the memory mat driver 32 shown in FIG. 4 through the contact conductor 69 provided at the other end of the memory mat in the X direction.

The sub-word lines SWL (including the dummy word line DWL and the mat active line ML) are embedded in the semiconductor substrate 50, as shown in FIGS. 2A, 2B, and 3B. A cap insulation film 51 (insulation element, first and second cap insulation films) that is elongated in the X direction is provided along a top surface of each of the sub-word lines SWL (a surface on a front side of the semiconductor substrate 50). In other words, the sub-word lines SWL are formed to cover a bottom surface 51c of the cap insulation film 51. It is preferable to use silicon nitride or silicon oxide as a material for the cap insulation film 51. The cap insulation film 51 is also embedded in the semiconductor substrate 50 as shown in FIG. 2A and the like. Bodies of the sub-word lines SWL are all embedded with reference to the surface of the semiconductor substrate 50, and all surfaces of the sub-word lines SWL (top surface, both side surfaces, and under surface (bottom surface)) are included in the semiconductor substrate 50. Apart of a body of the cap insulation film 51 is embedded with reference to the surface of the semiconductor substrate 50. Both side surfaces and a bottom surface of the cap insulation film 51, which constitute the part of the body, are included in the semiconductor substrate 50, and a top surface of the cap insulation film 51 is located at the same position as the surface of the semiconductor substrate 50. In the present embodiment, the cap insulation film 51 of which the both side surfaces and the bottom surface except for the top surface are included in the semiconductor substrate 50 is explained as "the cap insulation film 51 embedded in the semiconductor substrate 50". The top surface indicates a surface close to the surface of the semiconductor substrate 50, the bottom surface indicates a surface far from the surface of the semiconductor substrate 50, and the side surface indicates a surface that is orthogonal to the surface of the semiconductor substrate 50. The same is true for the following explanations.

The dummy word line DWL, as shown in FIG. 1, is drawn to an upper layer via a contact conductor 63 at an edge portion of the memory mat, and is connected to the ground line on the upper layer. Therefore, a potential of the dummy word line DWL is the ground potential VSS, and in the semiconductor device 1, the dummy word line DWL also functions as the cap insulation film.

In the semiconductor device 1, as shown in FIGS. 1 and 2A, an active region K is partitioned by the dummy word line DWL and the cap insulation film 51 formed along a top surface of the dummy word line DWL. Therefore, as shown in FIG. 1, the active region K extends in the X direction from end to end of the memory mat in a continuous manner. Two sub-word lines SWL are arranged in one active region K. Two global MOS transistors 13 corresponding to the two sub-word lines SWL and a plurality of memory cells MC (memory elements 11 and selection elements 12) are formed in the same active region K. An internal configuration of the active region K is explained in detail below.

As shown in FIG. 2A and the like, a gate insulation film is provided between the sub-word line SWL and the semiconductor substrate 50. The gate insulation film 52 is formed by forming a groove to form the sub-word line SWL on the semiconductor substrate 50 and then oxidizing its inner walls.

Furthermore, a first diffusion area 53 to a third diffusion area 55 are provided in the activation area K. The first diffusion area 53 is an N+ type impurity diffusion area that covers a first side surface 51a (a side surface on a far side from the memory element 11) of the cap insulation film 51 in the bit line direction, which is provided in contact with the side surface 51a. The second diffusion area 54 is an N+ type impurity diffusion area that covers a second side surface 51b (a side surface located on the other side of the side surface 51a) of the cap insulation film 51 in the bit line direction, which is provided in contact with the side surface 51b. The third diffusion area 55 is a P+ type impurity diffusion area that covers a top surface of the second diffusion area 54, which is provided in contact with the top surface of the second diffusion area 54.

The first and second diffusion areas 53 and 54 are formed by implanting an N-type (second conductive type) impurity in the surface of the semiconductor substrate 50. The third diffusion area 55 is formed by further implanting an impurity of the same conductive type as the semiconductor substrate 50 (P-type) in the surface of the second diffusion area 54.

It is preferable to implant the N-type impurity simultaneously in the first and second diffusion areas 53 and 54. In this way, a sum of a length of the second diffusion area 54 in the Z direction (a direction normal to the surface of the semiconductor substrate 50) and a length of the third diffusion area 55 in the Z direction becomes substantially same as a length of the first diffusion area 53 in the Z direction. In other words, by making the sum of the length of the second diffusion area 54 in the Z direction and the length of the third diffusion area 55 in the Z direction substantially same as the length of the first diffusion area 53 in the Z direction, it becomes possible to perform the implantation of the N-type impurity in the first and second diffusion areas 53 and 54 in a simultaneous manner.

As shown in FIG. 2A, the first to third diffusion areas 53 to 55 are provided between the surface of the semiconductor substrate 50 (hereinafter, "substrate surface") and a position with a first depth $D_1$ from the substrate surface. On the other hand, the sub-word line SWL is provided between a position with a second depth $D_2$ ($>D_1$) from the substrate surface and a position with a third depth $D_3$ ($>D_2$) from the substrate surface. With this configuration, bottom surfaces of the first and second diffusion areas 53 and 54 are provided at positions higher than a top surface of the sub-word line SWL, so that the first and second diffusion areas 53 and 54 and the sub-word line SWL are nonadjacent to each other across the gate insulation film 52.

The above configuration is taken to prevent a formation of a parasitic transistor. That is, if the sub-word line SWL and the first diffusion area 53 are adjacent to each other across the gate insulation film 52, for example, a MOS transistor (parasitic transistor) is formed with the sub-word line SWL as the control electrode and the third diffusion area 55 and the semiconductor substrate 50 as the control target electrodes. Because the formation of the parasitic transistor is not desirable, as described above, the bottom surfaces of the first and second diffusion areas 53 and 54 are provided at the positions higher than the top surface of the sub-word line SWL to prevent the formation of the parasitic transistor.

The third diffusion area 55 is, as shown in FIG. 3A, provided in a separate manner for each memory element 11. This separation can be achieved by forming the third diffusion area 55 and then performing an etching by using mask pattern. On the other hand, the first and second diffusion areas 53 and 54 are extending in the X direction from end to end of the memory mat in a continuous manner. After performing the etching by using the mask pattern, an insulation film can be formed at least on the surface of the substrate. This insulation film is a second insulation film for separating anodes of diodes that are adjacent to each other. The second insulation film can be an insulation film that is formed at a step of forming a contact conductor 67 or the memory cell MC.

On the top surface of the first diffusion area 53, as shown in FIG. 1, a slit-shaped contact conductor (slit conductor) 64 is formed extending in the X direction. The slit conductor 64 is, as shown in FIGS. 1 and 2B, connected to the source line SL1 via a contact conductor 65.

The second diffusion area 54 constitutes the drain line DL shown in FIG. 4. The second diffusion area 54 is drawn to an upper layer via a contact conductor 66 (see FIG. 1) provided at both ends of the memory mat, and connected to the sub-word line control unit 20 via the contact conductor 65.

The memory element 11 is formed on the top surface of the third diffusion area 55. Specifically, as shown in FIG. 2A and the like, the contact conductor 67 is formed on the top surface of the third diffusion area 55, and a lower electrode UE is formed on a top surface of the contact conductor 67. The phase change memory element GST composed of the phase change material mentioned above is then formed on a top surface of the lower electrode UE, and an upper electrode TE that is common to the memory elements 11 arranged in the bit line direction (Y direction) is formed on a top surface of the phase change memory element GST. The memory element 11 is constituted by the lower electrode UE, the phase change memory element GST, and the upper electrode TE. The upper electrode TE is electrically connected to the bit line BL via a contact conductor 68.

It is preferable to use a material having a relatively high electrical resistance, such as metal silicide, metal nitride, metal silicide nitride and the like, as the material of the lower electrode UE. Although it is not particularly limited, following materials can be preferably used: high melting point metal such as W, TiN, TaN, WN, TiAlN and the like; nitride of the high melting point metal; high melting point metal silicide nitride such as TiSiN, WSiN and the like; and TiCN and the like. In addition, it is preferable to use a metal material having a relatively low electrical resistance as the material of the lower electrode UE. For example, aluminum (Al), titanium (Ti), tungsten (W), or an alloy of these materials, or nitride of these materials and silicide of these materials can be preferably used.

The configuration in the activation area K is as explained above. A configuration near the mat active line ML is explained below.

As shown in FIGS. 1 and 3B, first diffusion areas 53a, 53b, 53a, and 53b are provided in order along the bit-line control unit 40 side from an inner side of the memory mat 10 at both sides of each of the memory active lines ML. A method of forming the first diffusion areas 53a and 53b is same as the method of forming the first diffusion area 53 (N+ type impurity diffusion area). Furthermore, in the same manner as the first diffusion area 53 described above, the slit conductor 64 is provided on top surfaces of the first diffusion areas 53a and 53b.

The first diffusion area 53a is, as shown in FIGS. 1 and 3B, connected to the source line SL1 via the contact conductor 65. On the other hand, the first diffusion area 53b is drawn to an upper layer (the same layer as the source line SL1) at a place different from the place of the cross section shown in FIG. 3B via the contact conductor 65 shown in FIG. 1, and its upper layer is connected to a ground line layer (not shown) at a further different place. Therefore, a potential of the first diffusion area 53b is the ground potential VSS.

A correspondence relation between the configuration of the semiconductor device 1 explained above and the selection element 12 and the transistors 13 and 31 shown in FIG. 4 is explained below.

As shown in FIG. 2A, the selection element 12 is realized by a PN junction formed with the second diffusion area 54 and the third diffusion area 55. The third diffusion area 55 that is a P-type constitutes the anode of the selection element 12, and the second diffusion area 54 that is an N-type constitutes the cathode of the selection element 12. Because the second diffusion area 54 also constitutes the drain line DL as described above, the cathode of the selection element 12 is connected to the drain line DL.

The transistor 13 (global MOS transistor) is, as shown in FIG. 2A, realized by the semiconductor substrate 50, the first and second diffusion areas 53 and 54, the sub-word line SWL, and the gate insulation film 52. Specifically, the sub-word line SWL constitutes the gate, the first diffusion area 53 constitutes the source, and the second diffusion area 54 constitutes the drain. Therefore, when the sub-word line SWL is activated, a channel is formed between the first diffusion area 53 and the second diffusion area 54 to make a conduction path. Because the first diffusion area 53 is connected to the source line SL1 via the slit conductor 64 and the contact conductor 65, the drain line DL (second diffusion area 54) is eventually connected to the source line SL1. When the sub-word line SWL is deactivated, the channel disappears, and the drain line DL and the source line SL1 are disconnected from each other.

The transistor 31 (mat-active MOS transistor) is, as shown in FIG. 3B, realized by the semiconductor substrate 50, the first diffusion areas 53a and 53b, the mat active line ML, and the gate insulation film 52. Specifically, the mat active line ML constitutes the gate, the first diffusion area 53b constitutes the source, and the first diffusion area 53a constitutes the drain. Therefore, when the mat active line ML is activated, a channel is formed between the first diffusion area 53a and the first diffusion area 53b to make a conduction path. Because the potential of the first diffusion area 53b is the ground potential VSS as described above and the first diffusion area 53a is connected to the source line SL1 via the slit conductor 64 and the contact conductor 65, the ground potential VSS is supplied to the source line SL1. When the mat active line ML is deactivated, the channel disappears, and the supply of the ground potential VSS to the source line SL1 is stopped. At this time, because all the sub-word lines SWL are also deactivated, the source line SL1 is put in a floating state.

In the same manner as the transistor 13 (global MOS transistor), the transistor 31 (mat-active MOS transistor) includes a transistor structure embedded in a groove, which is one of the characteristic features of the present invention. That is, an extending direction of the groove and an extending direction of the gate electrode (mat active line ML) are also the same. As described above, the memory mat 10 is realized with a small dimension by adopting a transistor structure embedded in the groove, including the selection element 12 (anode and cathode), the transistor 13 (global MOS transistor), and the transistor 31. The fact that the transistor 13 and the transistor 31 have the same structure means that the transistor 31 has the same fluctuation factor PVT (process fluctuation, voltage fluctuation, and temperature fluctuation) as that of the transistor 13, which is effective in maintaining "the balance between the total capability 1 of the transistors 13 and the total capability 2 of the transistors 31" that is described above and will be described later.

As explained above, with the semiconductor device 1 according to the present embodiment, it is possible to put the source of the transistor 13 in a floating state when the memory mat is deactivated. In addition, it is realized with a configuration of the transistor 31 and the source line SL that can be achieved in an easy manner. Therefore, with the semiconductor device 1 according to the present embodiment, it is possible to suppress the standby current of the memory mat to a value equal to or smaller than the value of standard with an easily achievable configuration.

The total capability 1 and the total capability 2 in the second case described above are explained in detail below. When a short circuit (defect) of the source line SL or a short circuit of the source of the transistor 13 (a short circuit (defect) between the first diffusion area 53 and the second diffusion area 54) is dominant in the standby current of the memory mat, the standby current of the memory mat becomes a balance between the total capability 1 of the transistors 13 and the total capability 2 of the transistors 31. Firstly, as shown in FIG. 2A, a groove is formed on the semiconductor substrate 50 to form the sub-word line SWL. In a manufacturing process of forming the gate insulation film 52, the sub-word line SWL, and the cap insulation film 51 in the groove, for example, it is assumed that there is a defect in the cap insulation film 51 pertaining to the global MOS transistor 13. When there is a defect in the cap insulation film 51, the first diffusion area 53 (the source line SL) and the second diffusion area 54 (the drain line DL), which are side walls on both sides, are short-circuited with an impedance value according to a degree of the defect. Although a segment memory cell array pertaining to the global MOS transistor 13 having the defect (which is defined by a plurality of memory cells MC connected to one drain line DL pertaining to the global MOS transistor 13 having the defect) is saved by a redundant memory cell (not shown), a DC current caused by the defect make a contribution to the standby current of the memory mat. Therefore, it is preferable that the total capability 2 of the mat-active MOS transistors 31 be smaller than the total capability 1 of the global MOS transistors 13 corresponding to a plurality of segment memory cell arrays. Furthermore, the relation between the total capability 1 and the total capability 2 is also effective in a case where a defect occurs in the mat-active MOS transistor 31 that has the same transistor structure (the transistor structure embedded in the groove) as the global MOS transistor 13.

Although there has been explained an example in which the transistors 31 are arranged four by four at both sides of the memory mat 10 in the Y direction for the semiconductor device 1 according to the present embodiment, the number of transistors 31 is not limited to a particular number according to a necessary drive capability required for the transistor 31. Alternatively, it also suffices to arrange the transistors 31 at a single side in the Y direction.

Furthermore, although two adjacent bit lines BL from among a plurality of bit lines BL are replaced with the source line SL1, the configuration is not limited thereto, and one or any optional number of adjacent bit lines can be replaced.

Figure 7:
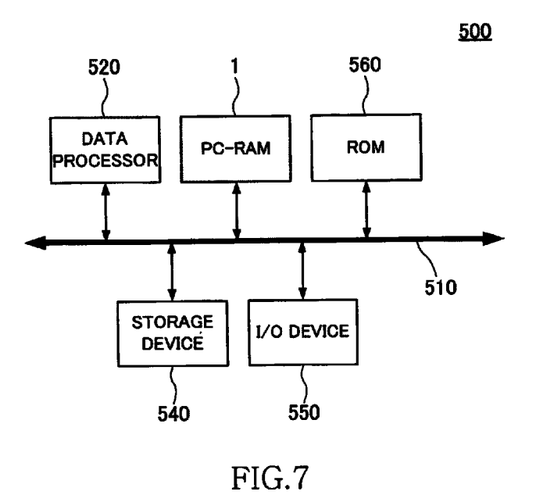
FIG. 7 is a block diagram showing the configuration of a data processing system according to an embodiment of the present invention.

FIG. 7 is a block diagram showing the configuration of a data processing system 500 using the semiconductor device 1 according to this embodiment.

The data processing system 500 shown in FIG. 7 has a configuration in which a data processor 520 and the semiconductor device (PC-RAM) 1 according to this embodiment are mutually connected via a system bus 510. The data processor 520, for example, includes micro-processor (MPU) or digital signal processor (DSP). But it is not limited to them. In FIG. 7, for the sake of shorthand, the data processor 520 and the PC-RAM 1 are connected via the system bus 510. But they may be connected using a local bus not via the system bus 510.

In FIG. 7, for the sake of shorthand, only one set of the system bus 510 is drawn. But a plurality of system buses 510 may be provided in serial or parallel manner via some connectors etc., if needed. In the data processing system 500 shown in FIG. 7, a storage device 540, I/O device 550, and ROM 560 are also connected to the system bus 510. But these components are not in dispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to.

I/O device 550 can be only one of the input device and the output device.

Though only one component is drawn for each of the components shown in FIG. 7, the number of each of the components is not limited to one. The data processing system 500 can include a plurality of each of the components.

It is apparent that the present invention is not limited to the above embodiments, but may be modified and changed without departing from the scope and spirit of the invention.

The basic technical concept of the present invention can be applied to other types of memories in addition to the PC-RAM explained in the above embodiment, such as a Re-RAM (Resistance Random Access Memory) and the like. It can be also applied to a memory employing other types of nonvolatile memory elements. Furthermore, circuit configurations of the memory mat, the sub-word line control unit, the power supply unit, the mat-active control unit, and the bit-line control unit and circuit configurations of circuits that generate other controls signals are not limited to those described in the above embodiment.

The basic technical concept of the present invention can be applied to various types of semiconductor devices. For example, the present invention can be applied to semiconductor devices in general, such as a CPU (Central Processing Unit), an MCU (Micro Control Unit), a DSP (Digital Signal Processor), an ASIC (Application Specific Integrated Circuit), an ASSP (Application Specific Standard Circuit), or Memory which has an information storage function. For example, an SOC (System on Chip), an MCP (Multi Chip Package), and a POP (Package on Package) can be mentioned as product formats of such a semiconductor device to which the present invention is applied. The present invention is applicable to semiconductor devices with the above arbitrary product format or package format.

Furthermore, although an example is described in the above embodiment in which the selection element includes a MOS transistor, the present invention is not limited a MOS transistor, but can be applied to other types of transistors as long as they are field effect transistors (FETs). That is, the present invention can be also applied to various other FETs such as a MIS (Metal-Insulator Semiconductor) and a TFT (Thin Film Transistor) other than a MOS (Metal Oxide Semiconductor). Further, a bipolar transistor can be used in a part of the semiconductor device.

Various combinations and selections of the components disclosed herein may be made within the scope of the invention. In other words, the present invention of course includes various changes and modifications that are obvious to those skilled in the art according to all the disclosure including the claims and the technical concept.

The semiconductor device according to the present invention can be also configured as follows.

A first semiconductor device according to another aspect of the present invention includes at least one word line and at least one bit line, a memory mat including a plurality of memory cells arranged at every intersection of the word line and the bit line and each including a memory element and a diode connected in series, a first signal line that is provided for each word line and connected to the cathode of the diode in a corresponding one of the memory cells, at least one first transistor arranged for each word line, of which a control terminal is connected to its corresponding word line and one control target terminal is connected to the first signal line, and a control circuit that supplies a first potential to the other control target terminal of the first transistor when the memory mat is selected and puts the other control target terminal of the first transistor in a floating state when the memory mat is not selected.

A second semiconductor device according to another aspect of the present invention further include, in the first semiconductor device, a third signal line connected to the other control target terminal of the first transistor, a first power supply line to which the first potential is supplied, and at least one second transistor connected between the third signal line and the first power supply line. The control circuit causes the second transistor to be electrically conductive when the memory mat is selected and to be electrically non-conductive when the memory mat is not selected.

A third semiconductor device according to another aspect of the present invention further includes, in the second semiconductor device, a second power supply line to which a second potential that is higher than the first potential is supplied and at least one third transistor that is provided for each word line and connected between the first signal line corresponding to a word line and the second power supply line. The control circuit causes the third transistor to be electrically non-conductive when its corresponding word line is selected and to be electrically conductive when the word line is not selected.

A fourth semiconductor device according to another aspect of the present invention is such that, in the third semiconductor device, the control circuit further includes a power supply unit that supplies the second potential to the second power supply line, the power supply unit supplies a potential that is equal to or higher than the write potential to be applied to the bit line when a write operation is performed on any one of the memory cells to the second power supply line as the second potential and a potential that is equal to or higher than the read potential and lower than the write potential to be applied to the bit line when a read operation is performed on any one of the memory cells to the second power supply line as the second potential.

A fifth semiconductor device according to another aspect of the present invention further includes, in any one of the first to fourth semiconductor devices, a semiconductor substrate of a first conductive type, a cap insulation film embedded in the semiconductor substrate, including a first side surface, a second side surface located at the other side of the first side surface, and a bottom surface, a first diffusion area of a second conductive type that covers the first side surface of the cap insulation film, a second diffusion area of the second conductive type that covers the second side surface of the cap insulation film, and a third diffusion area of the first conductive type that covers a top surface of the second diffusion area. The first diffusion area constitutes the other control target terminal of the first transistor, the second diffusion area constitutes the one control target terminal of the first transistor, the word line constitutes the control terminal of the first transistor with its top surface formed to be covered by the bottom surface of the cap insulation film, and the second and third diffusion areas constitute the diode.

A sixth semiconductor device according to another aspect of the present invention further includes, in the fifth semiconductor device, a third signal line connected to the other control target terminal of the first transistor, a first power supply line to which the first potential is supplied, a plurality of second transistors connected between the third signal line and the first power supply line, and a sixth signal line that constitutes control electrodes of the second transistors with a single structure. The sixth signal line has the same structure as the word line, and the second transistor and the first transistor have the same structure with each other.

A seventh semiconductor device according to another aspect of the present invention is such that, in the sixth semiconductor device, the sixth signal line and the word line are extending in the same direction.

An eighth semiconductor device according to another aspect of the present invention is such that, in the second semiconductor device, the capability of a plurality of second transistors pertaining to a plurality of memory cells is smaller than the capability of a plurality of first transistors pertaining to the memory cells.

The ninth semiconductor device according to another aspect of the present invention is such that, in the third semiconductor device, the capability of the second transistors pertaining to the memory cells is smaller than the capability of the first transistors pertaining to the memory cells, and the capability of a plurality of third transistors pertaining to the memory cells is smaller than the capability of the first transistors pertaining to the memory cells.

A tenth semiconductor device according to another aspect of the present invention is such that, in the fifth semiconductor device, atop surface of the word line is located at a position lower than a bottom surface of the first diffusion area and a bottom surface of the second diffusion area.

A eleventh semiconductor device according to another aspect of the present invention is such that, in the fifth or tenth semiconductor device, a sum of a length of the second diffusion area in the vertical direction and a length of the third diffusion area in the vertical direction is substantially same as a length of the first diffusion area in the vertical direction.

An twelfth semiconductor device according to another aspect of the present invention is such that, in any one of the fifth, tenth, and eleventh semiconductor devices, a first memory cell and a second memory cell adjacent to each other in the extending direction of the bit line from among the memory cells share the first diffusion area and have a symmetrical structure across the first diffusion area.

A thirteenth semiconductor device according to another aspect of the present invention is such that, in any one of the fifth, tenth to twelfth semiconductor devices, the cap insulation film includes a first cap insulation film and a second cap insulation film opposite sides of the second and third diffusion areas, the word line constitutes the control terminal of the first transistor by being formed to cover a bottom surface of the first cap insulation film, a dummy word line that covers the bottom surface of the second cap insulation film is further included, and the dummy word line is supplied with the first potential.

In addition, a data processing system including a data processor and a memory connected to the data processor can be built in the following manner using the present invention. That is, a data processing system according to the present invention includes a data processor and a memory connected to the data processor, in which the memory includes a plurality of first signal lines each being commonly connected to first nodes of a plurality of memory cells, a plurality of second signal lines respectively connected to second nodes of the memory cells, a third signal line, a first transistor that connects the first signal lines to the third signal line, a second transistor that connects the third signal line to a first potential in response to an access to a memory cell, and a control circuit. The control circuit, under control in which the memory cells are all deactivated, controls the first signal lines to a second potential that is higher than the first potential and controls the first and second transistors to be deactivated, thus controlling the third signal line to be in a floating state.

What is claimed is:

1. A semiconductor device comprising:
   a plurality of memory cells each having first and second nodes;
   a first signal line commonly connected to the first nodes of the memory cells;
   a plurality of second signal lines each connected to an associated one of the second nodes of the memory cells;
   a third signal line;
   a first transistor connected between the first signal line and the third signal line;
   a second transistor connected between the third signal line and a line of a first potential; and
   a control circuit that brings the first signal line into a second potential that is higher than the first potential and turns the first and second transistors off so that the third signal line to be in a floating state when the memory cells are not selected.

2. The semiconductor device as claimed in claim 1, wherein
   each of the memory cells includes a diode and a memory element connected in series,
   each of the first nodes is defined at one end portion of each of the memory cells corresponding to a cathode side of the diode, and
   each of the second nodes is defined at another end portion of each of the memory cells corresponding to an anode side of the diode.

3. The semiconductor device as claimed in claim 2, wherein the control circuit further brings the second signal lines into a floating state when the memory cells are not selected.

4. The semiconductor device as claimed in claim 2, further comprising a plurality of sense amplifiers each connected to an associated one of the second signal lines, wherein
   the second transistor is arranged between the memory cells and the sense amplifiers.

5. The semiconductor device as claimed in claim 2, wherein
   the first signal line extends in a first direction,
   the second signal lines extend in a second direction that is substantially orthogonal to the first direction, and
   the third signal line includes a plurality of first partial lines extending in the second direction arranged between the second signal lines for every predetermined number of second signal lines.

6. The semiconductor device as claimed in claim 5, wherein the third signal line further includes at least one second partial line extending in the first direction.

7. The semiconductor device as claimed in claim 1, further comprising a substrate, wherein
   both a control electrode of the first transistor and a control electrode of the second transistor are embedded in the substrate.

8. The semiconductor device as claimed in claim 7, further comprising a fourth signal line and a sixth signal line, wherein
   a plurality of the first transistors are provided,
   the fourth signal line is constituted of control electrodes of the first transistors as one structure,
   the sixth signal line is constituted of the control electrode of the second transistor, and
   the fourth signal line and the sixth signal line are embedded in the substrate.

9. The semiconductor device as claimed in claim 8, wherein
   a plurality of the second transistors are provided, and
   the sixth signal line is constituted of control electrodes of the second transistors as one structure.

10. The semiconductor device as claimed in claim 9, wherein
    the fourth and sixth signal lines extend in a first direction, and
    the second signal lines extend in a second direction that is substantially orthogonal to the first direction.

11. The semiconductor device as claimed in claim 7, further comprising a plurality of sense amplifiers each connected to an associated one of the second signal lines, wherein
    the second transistor is arranged between the memory cells and the sense amplifiers.

12. The semiconductor device as claimed in claim 7, wherein
    each of the memory cells includes a diode and a memory element connected in series,
    each of the first nodes is defined at one end portion of each of the memory cells corresponding to a cathode side of the diode, and
    each of the second nodes is defined at another end portion of each of the memory cells corresponding to an anode side of the diode.

13. The semiconductor device as claimed in claim 7, further comprising a fourth signal line that is constituted of a control electrode of the first transistor, wherein
    each of the memory cells includes a diode and a memory element connected in series,
    the diode is formed between a surface of the substrate and a position with a first depth from the surface in the substrate,
    the fourth signal line is formed between a position with a second depth from the surface in the substrate and a position with a third depth from the surface in the substrate,
    the second depth is deeper than the first depth, and
    the third depth is deeper than the second depth.

14. The semiconductor device as claimed in claim 13, wherein
    the memory cells include a first of the diode and a second of the diode arranged being adjacent to an extending direction of the second signal lines, and
    the first and second diodes are adjacent to each other via an insulating element embedded in the surface of the substrate,
    the semiconductor device further comprising a fifth signal line having a same structure as the fourth signal line and the fifth signal line arranged below the insulating element.

15. The semiconductor device as claimed in claim 1, wherein a current drive capability of the second transistor is smaller than a current drive capability of the first transistor.

16. The semiconductor device as claimed in claim 15, wherein
    a plurality of the first signal lines each connected to different memory cells are provided,
    a plurality of the first transistors each connected to an associated one of the first signal lines are provided,
    the control circuit further includes:
    a power supply circuit that supplies a potential to the first signal lines; and
    a plurality of third transistors respectively supplying an output potential of the power supply circuit to the first signal lines, and the current drive capability of each of the first transistors is larger than a current drive capability of each of the third transistors.

17. The semiconductor device as claimed in claim 15, wherein
each of the memory cells includes a diode and a memory element connected in series,
each of the first nodes is defined at one end portion of each of the memory cells corresponding to a cathode side of the diode, and
each of the second nodes is defined at another end portion of each of the memory cells corresponding to an anode side of the diode.

18. The semiconductor device as claimed in claim 1, wherein
a plurality of the first signal lines each connected to different memory cells are provided,
a plurality of the first transistors each connected to an associated one of the first signal lines are provided,
the control circuit further includes:
a power supply circuit that supplies a potential to the first signal lines; and
a plurality of third transistors respectively supplying an output potential of the power supply circuit to the first signal lines, and
the power supply circuit supplies the second potential to the first signal lines via the third transistors when the memory cells are not selected.

19. The semiconductor device as claimed in claim 18, wherein the power supply circuit supplies the second potential to the first signal lines in response to a write access to the memory cell, and a third potential that is higher than the second potential to the first signal lines in response to a read access to the memory cell.

20. The semiconductor device as claimed in claim 19, wherein
the control circuit selectively turns parts of the third transistors off corresponding to the first signal line connected to an access target memory cell, and
the control circuit selectively turns remaining parts of the third transistors on corresponding to the first signal line connected to a non-access target memory cell.

21. The semiconductor device as claimed in claim 20, further comprising a plurality of fourth signal lines corresponding to the first signal lines respectively and respectively connected to gate electrodes of a plurality of first transistors, the first transistors respectively connected between the first signal lines and the third signal line, wherein
gate electrodes of the third transistors are supplied with signals respectively corresponding to the fourth signal lines.

22. The semiconductor device as claimed in claim 18, wherein
each of the memory cells includes a diode and a memory element connected in series,
each of the first nodes is defined at one end portion of each of the memory cells corresponding to a cathode side of the diode, and
each of the second nodes is defined at another end portion of each of the memory cells corresponding to an anode side of the diode.

* * * * *